United States Patent [19]
Kakehi

[11] Patent Number: 5,268,536
[45] Date of Patent: Dec. 7, 1993

[54] METHOD OF CONNECTING A LEAD OF A MOUNTING PART WITH A LAND OF A CIRCUIT SUBSTRATE

[75] Inventor: Fujio Kakehi, Nagoya, Japan

[73] Assignee: Brother Kogyo Kabushiki Kaisha, Nagoya, Japan

[21] Appl. No.: 961,626

[22] Filed: Oct. 16, 1992

[30] Foreign Application Priority Data

Oct. 28, 1991 [JP] Japan .................. 3-096720[U]

[51] Int. Cl.$^5$ ............................................ H05K 1/00
[52] U.S. Cl. ................................. 174/259; 174/260; 361/777
[58] Field of Search ............... 174/250, 259, 260, 261; 361/400, 403, 414, 417, 418, 777

[56] References Cited

U.S. PATENT DOCUMENTS 4,796,078  1/1989  Phelps, Jr. et al. .
4,818,823  4/1989  Bradley .
5,175,612  12/1992  Long et al. .

Primary Examiner—Leo P. Picard
Assistant Examiner—Cheryl R. Figlin
Attorney, Agent, or Firm—Oliff & Berridge

[57] ABSTRACT

A coating pattern is used for coating a conductive adhesive on a plurality of lands of a circuit substrate. According to the pattern, one land is coated with the conductive adhesive on the area corresponding to a tip of a downwardly inclined lead. An adjacent land is coated with the conductive adhesive except on the area corresponding to the tip of the lead. The pattern alternates on adjacent lands. Therefore, when the leads are connected with the lands of the circuit substrate, the conductive adhesive which is expanded in the vicinity of the tip of the lead does not come in contact with the conductive adhesive of an adjacent land.

13 Claims, 6 Drawing Sheets

METHOD OF CONNECTING A LEAD OF A MOUNTING PART WITH A LAND OF A CIRCUIT SUBSTRATE

BACKGROUND OF THE INVENTION

1. Field of the Invention

The present invention relates to a method of mounting a flat package surface mounting part, such as a large scale integrated circuit (LSI) or an integrated circuit (IC), on a circuit substrate having conductive ink deposited thereon.

2. Description of Related Art

It is known that a surface mounting part such as an LSI or IC can be mounted on a circuit substrate with conductive adhesive. The surface mounting part is electrically connected to lands of the circuit substrate formed by a conductive ink print with conductive adhesive. Conventionally, the shape of the surface mounting part such as a chip diode or chip LED is a guadrilateral with certain intervals between adjacent electrode leads thereof. However, the surface mounting part for an IC for example has at least sixty-four pins to be mounted with the conductive adhesive which is not practical.

Nevertheless, in recent years, surface mounting parts having a plurality of pins have been connected to a circuit substrate by conductive adhesive. However, the conductive adhesive is made of conductive material comprising mainly silver (Ag) to provide a good electric connection and adhesive material to fix the surface mounting part on a conductive ink print circuit substrate. Therefore, the viscosity of the above-mentioned conductive adhesive is less than that of a cream solder for a rigid substrate. To provide sufficient electric property and mechanical property of the conductive adhesive, an emulsion of the conductive adhesive has to be coated in a 0.2–0.3 millimeter thickness. After the conductive ink print circuit substrate is coated with the conductive adhesive, the surface mounting part is mounted on the conductive ink print circuit substrate. The conductive adhesive is then pressed so as to be expanded by electrode leads of the surface mounting part. However, the pressed conductive adhesive on adjacent lands tend to expand and come in contact with each other. Therefore, a circuit pattern must be arranged around the surface mounting part in order to avoid the expanded conductive adhesive. Moreover, the surface mounting part has to be a quadrilateral chip of a comparatively large size and have electrode leads which are sufficiently spaced apart in order to avoid the expanding adhesive on adjacent leads.

SUMMARY OF THE INVENTION

It is therefore an object of the present invention to provide a surface mounting part having a plurality of closely arranged leads, the surface mounting part being easily mounted on a circuit substrate by controlling expansion of the conductive adhesive while the surface mounting part is mounted. Further, it is an object of the present invention to provide a surface mounting part comprising few parts to reduce the cost.

To achieve the above-mentioned and other objects, in a method of connecting a plurality of leads of a mounting part with a plurality of lands corresponding to the leads on a circuit substrate by conductive adhesive, a tip of at least two leads of the leads inclining downward and the mounting part being electrically connected with the circuit substrate by connecting the leads with the lands, the present invention provides the method comprising the steps of: coating the conductive adhesive on a first portion of a first land of the plurality of lands, said first portion corresponding to the tip of one lead of the two leads, and on a second portion of a second land adjacent to the first land, the second portion corresponding to a part of another lead except at the tip.

According to the above-mentioned method, the first portion corresponds to the tip of the lead inclining downward and the second portion corresponds to the part of the other lead except at the tip, the conductive adhesive is coated on the first portion of the first land of the plurality of lands and on the second portion of a second land adjacent to the first land. Thereby the mounting part is electrically connected with the circuit substrate.

Therefore, when the leads of the surface mounting part are connected with the lands of the circuit substrate, the conductive adhesive which is expanded in the vicinity of the tip of the lead does not come in contact with the conductive adhesive of the adjacent land. Thus, the surface mounting part, such as an LSI or IC, having a plurality of closely arranged leads can be connected with the circuit substrate. Since a conventional surface mounting part does not have many leads, there is a need to connect a plurality of surface mounting parts with a plurality of circuit substrates. However, according to the present invention, there is no need to provide additional surface mounting parts. Therefore, the cost can be reduced.

BRIEF DESCRIPTION OF THE DRAWINGS

A preferred embodiment of the present invention will be described in detail with reference to the following figures wherein:

FIG. 1(B) is a plan view of the circuit substrate coated with conductive adhesive;

DETAILED DESCRIPTION OF PREFERRED EMBODIMENTS

Hereinafter, an embodiment of the present invention will be explained with reference to the figures.

Figure 1:
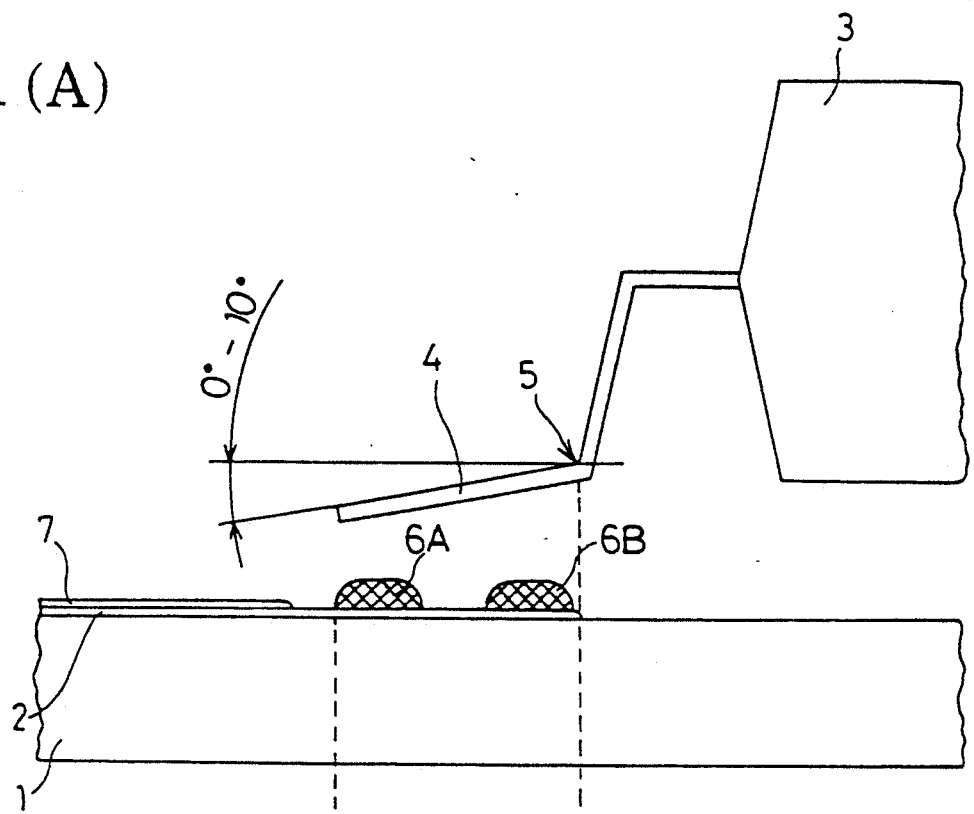
FIG. 1 (A) is a side view of a surface mounting part and a circuit substrate of one embodiment of the present invention before the surface mounting part is mounted on the circuit substrate.
Figure 1:
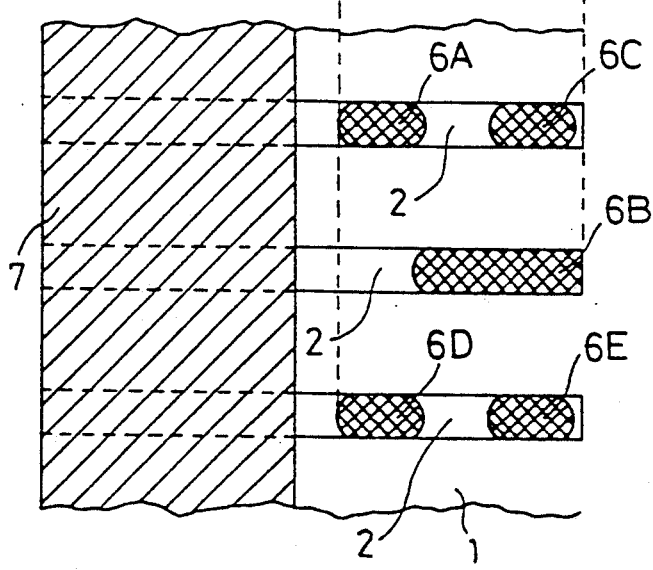

A circuit substrate 1, preferably made from a polyester film which is flexible, has a plurality of lands 2 formed thereon. As seen in FIG. 1(B), lands 2 are generally parallel to each other. Lands 2 are formed by a conductive ink print. Each of a plurality of leads 4 of a surface mounting part 3 is electrically connected to each of the lands 2, respectively. As seen in FIG. 1(A), the lead 4 inclines downward from a lead forming point 5 toward the pointed head thereof at an angle of about 0–10 degrees.

Figure 2:
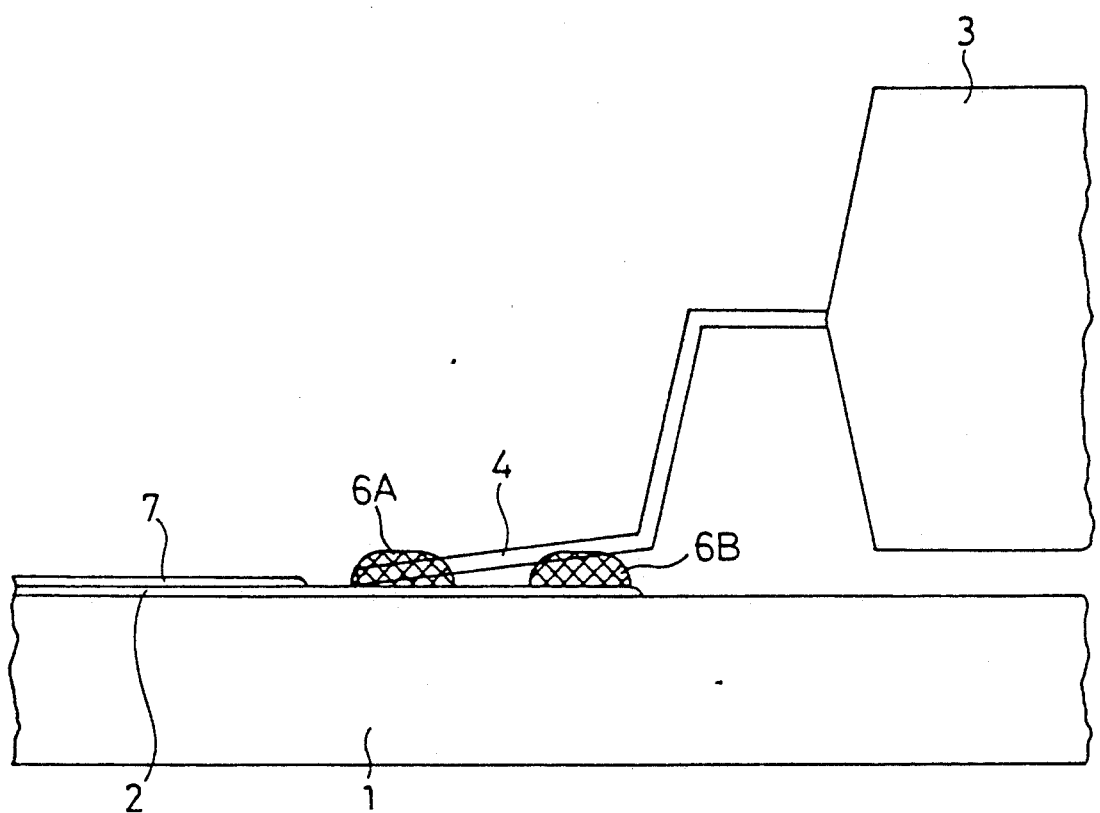
FIG. 2 is a side view of the surface mounting part and the circuit substrate after the surface mounting part is mounted on the circuit substrate.

As shown in FIG. 1(B), the lands 2 are coated with conductive adhesive in patches 6A, 6B, 6C, 6D and 6E arranged in a coating pattern. That is, one land 2 is coated with conductive adhesive patches arranged at an interval such that the conductive adhesive patch 6A is located on the area of land 2 which corresponds to a tip of the lead 4 and conductive adhesive patch 6C is located on the area of land 2 which corresponds to the lead forming point 5, as seen in FIG. 2. The other land 2 is coated with conductive adhesive on the end thereof as patch 6B, leaving the area corresponding to the tip of the lead 4 free of adhesive. The leads 2 are arranged adjacent to each other and have alternating coating patterns as shown in FIG. 1(B). The remainder of each land 2 is covered with a resist 7.

The conductive adhesive coating pattern is effective for lead 4 which inclines downward toward the tip thereof. When the surface mounting part 3 is mounted on lands 2 of the conductive ink print substrate by an automatic chip mounter, one lead 4 comes in contact with the conductive adhesive patch 6A (6D), and the tip of the inclining lead 4 is pressed down to the conductive ink print pattern. The next lead 4 comes in contact with the conductive adhesive patch 6B. The lead 4 which is pressed down to the conductive adhesive patch 6A (6D) further comes in contact with the conductive adhesive patch 6C (6E). In this way, the leads 4 push the conductive adhesive such that the conductive adhesive on adjacent lands is alternately expanded. For example, as shown in FIG. 1(B), the order of expansion of the conductive adhesive patches is 6A (6D), 6B, 6C (6E) as lead 4 is pressed down. Since the lead 4 inclines downward from the lead forming point 5 toward the tip thereof, the amount of conductive adhesive which is expanded is decreased toward the lead forming point 5. Therefore, although the conductive adhesive patches 6B and 6C (6E) are adjacent to each other, the expanded conductive adhesive patches 6B and 6C (6E) do not come into contact with each other.

The automatic chip mounter presses the surface mounting part 3 toward the conductive ink print substrate such that the lead forming point 5 of one lead 4 comes in contact with the conductive adhesive patch 6B, such that the lead forming point 5 does not bend under the pressure. If the lead 4 is too strongly pressed down, the lead forming point 5 will bend. Should the lead forming point 5 bend, the conductive adhesive corresponding to the bent lead forming point 5 may be unnecessarily expanded. Therefore, according to the present invention, the conductive adhesive of adjacent lands 2 are coated with different coating patterns. Then, even if the conductive adhesive in the vicinity of the tip of the lead 4 is expanded too much, the expanded conductive adhesive will not come in touch with the conductive adhesive of an adjacent land. This arrangement allows not only a chip diode and chip LED to be mounted on the circuit substrate, but also active circuit parts, such as an LSI or IC, having a plurality of closely arranged pins.

Figure 3:
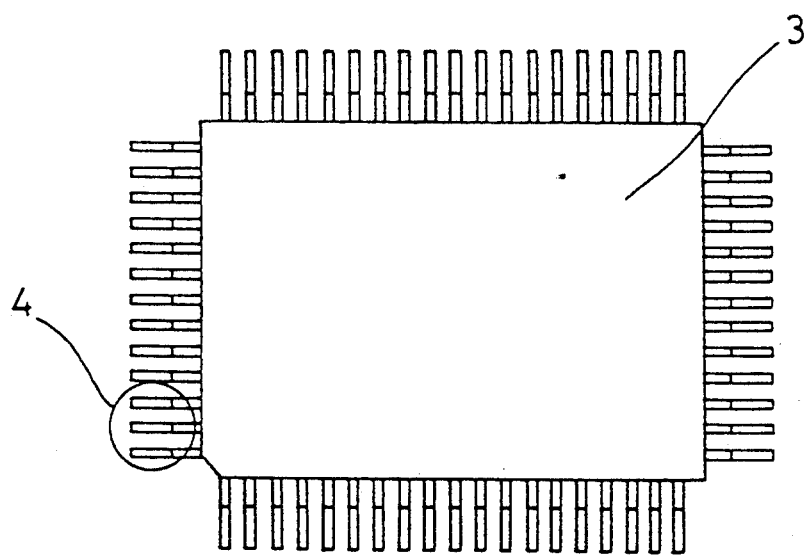
FIG. 3 is a plan view of the surface mounting part.
Figure 4:
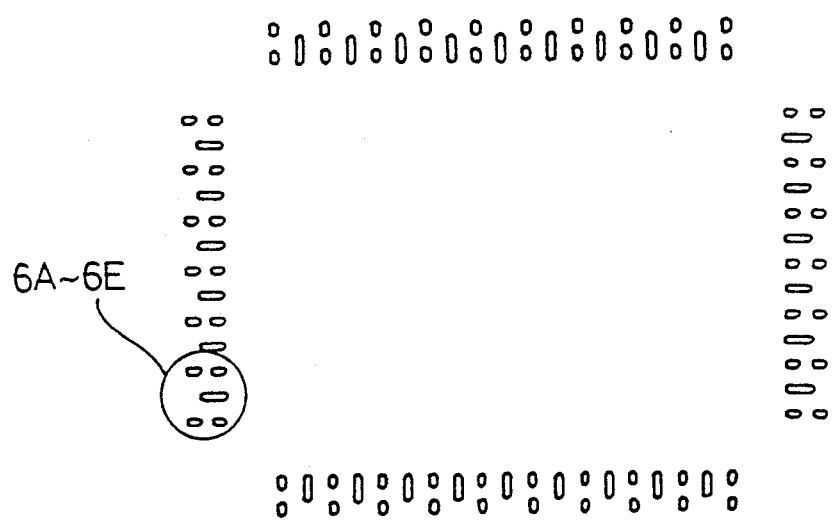
FIG. 4 is a plan view of adhesive discharge portions for coating the conductive adhesive.
Figure 5:
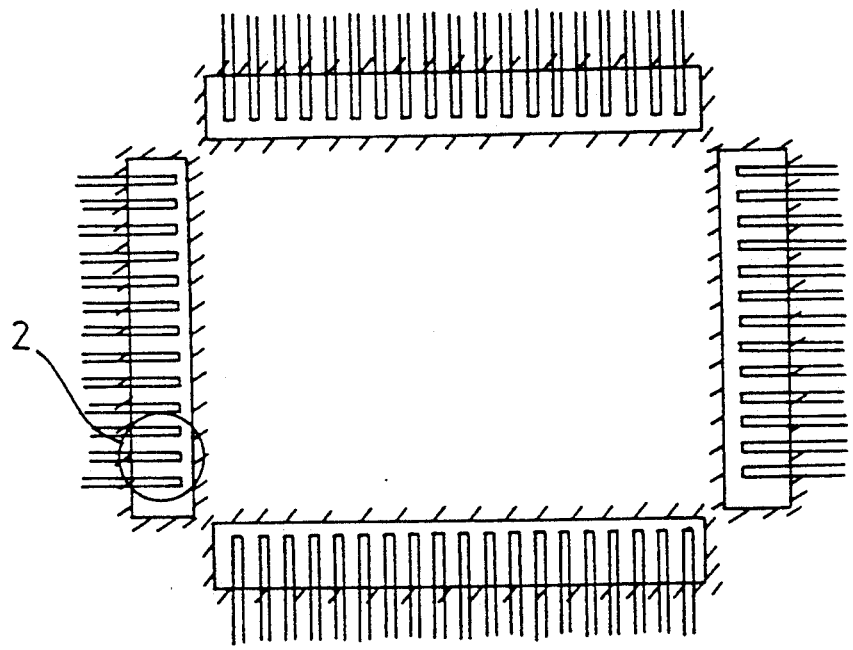
FIG. 5 is a plan view of lands of the circuit substrate.
Figure 6:
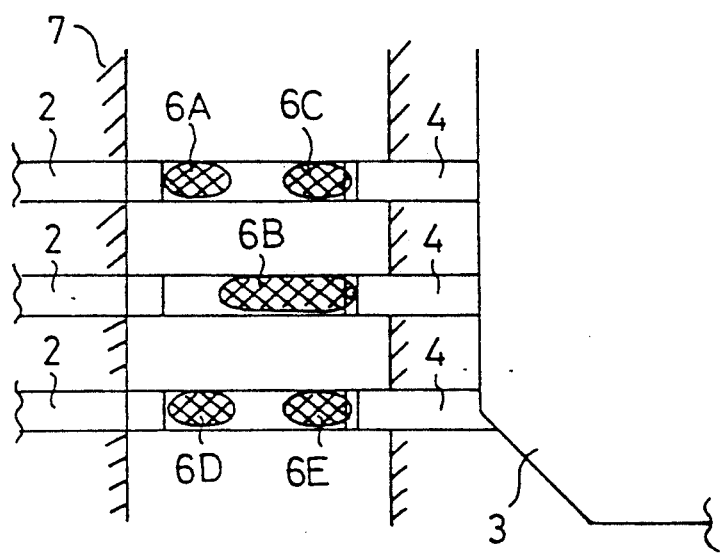
FIG. 6 is a partial plan view of the mounted surface mounting part.

An example of a design of a mounted surface mounting part 3 having sixty-four pins is shown with reference to FIGS. 3-5. FIG. 3 is a schematic view of the surface mounting part. FIG. 4 is a schematic view of adhesive discharge portions for coating conductive adhesive patches onto lands according to the above-mentioned pattern. FIG. 5 is a plan view of lands 2 of the circuit substrate 1. FIG. 6 is a partial plan view of the mounted surface mounting part 3. FIG. 6 is shown as a model in order to show the positions of the conductive adhesive patches.

The present invention is not limited to the above-mentioned embodiment. It should be understood that many changes and modifications may be made in the embodiment without departing from the scope of the present invention. For instance, the conductive adhesive may be coated continuously such that one of an adjacent land is coated with the conductive adhesive except at the area corresponding to the tip of the lead, while the other land is coated with the conductive adhesive over the length of the land.

What is claimed is:

1. A method of mounting a surface mounting part to a circuit substrate with a conductive adhesive, the surface mounting part having a plurality of aligned resilient electrode leads each having an elongated body with a tip on one end and a base on another end, the body and the tip being downwardly inclined from the base, the circuit substrate having a plurality of adjacent lands each with a conductive ink print thereon and positioned to correspond to the electrode leads, the method comprising the steps of:
   coating the conductive adhesive on a portion of a first land corresponding to the tip of a first lead, leaving the portion of the first land corresponding to the body of the lead free of adhesive; and
   coating the conductive adhesive on a portion of a second land adjacent the first land corresponding to the body of an adjacent second lead, leaving the portion of the second land corresponding to the tip of the second lead free of adhesive, thus forming an alternating pattern of adhesive on adjacent lands.

2. The method according to claim 1, further comprising:
   coating the conductive adhesive on another portion of the first land spaced from the first coated portion and corresponding to the base of the first lead.

3. The method according to claim 2, wherein the step of coating the conductive adhesive on the second land includes leaving the portion of the land corresponding to the base of the second lead free of adhesive.

4. The method according to claim 1, further comprising the step of:
   pressing the leads onto the adhesively coated lands so that the inclined tips of the leads contact the lands first.

5. A method of forming a circuit substrate having a plurality of adjacent lands with conductive ink prints thereon comprising the steps of:
   depositing conductive adhesive on a portion of one land forming an adhesive patch and a free portion on the land;
   depositing conductive adhesive on a portion of an adjacent land forming an adhesive patch aligned with the free portion of the adjacent land and a free portion aligned with the adhesive patch of the adjacent land.

6. The method according to claim 5, further comprising the steps of:
   depositing additional conductive adhesive on a portion of one land forming a pair of adhesive patches separated by the free portion, wherein the adhesive patch of the adjacent land is aligned with the free portion separating the pair of adhesive patches.

7. A circuit substrate having a plurality of adjacent longitudinal lands each with a conductive ink print, wherein said lands have conductive adhesive thereon arranged in a pattern of adjacent alternating adhesive patches.

8. A circuit substrate comprising a first land with a conductive ink print thereon including a first portion having conductive adhesive thereon and a second portion free of conductive adhesive; and a second land with a conductive ink print thereon adjacent said first land and including a first portion, free of conductive adhesive and aligned with said first portion of said first land, and a second portion having conductive adhesive thereon and aligned with said second portion of said first land.

9. The circuit substrate according to claim 8 further comprising a plurality of first and second lands arranged adjacent to each other such that a pattern of alternating conductive adhesive is formed across the plurality of lands.

10. The circuit substrate according to claim 8 wherein:

said first land includes a third portion adjacent said second portion having conductive adhesive thereon, and said second land includes a third portion adjacent said second portion free of conductive adhesive, wherein said third portion of said first land is aligned with said third portion of said second land.

11. A surface mounting part mounted to a circuit substrate, wherein said surface mounting part comprises a plurality of aligned resilient electrode leads each having an elongated body with a tip on one end and a base on another end, said body and said tip being downwardly inclined from said base; and said circuit substrate comprising a plurality of adjacent lands each with a conductive ink print thereon and positioned to correspond to said electrode leads, wherein a first land includes a first portion having conductive adhesive thereon and a second portion free of conductive adhesive, and a second land adjacent said first land includes a first portion, free of conductive adhesive and aligned with said first portion of said first land, and a second portion having conductive adhesive thereon and aligned with said second portion of said first land;

wherein one of said leads is pressed onto said first land and said tip of said lead contacts said first portion having adhesive thereon and said body contacts said second portion free of adhesive, and an adjacent lead is pressed onto said second land and said tip of said adjacent lead contacts said first portion of said second land free of adhesive and said body contacts said second portion having conductive adhesive thereon.

12. The circuit substrate according to claim 11 further comprising a plurality of first and second lands arranged adjacent to each other such that a pattern of alternating conductive adhesive is formed across the plurality of lands.

13. The circuit substrate according to claim 11 wherein:

said first land includes a third portion adjacent said second portion having conductive adhesive thereon, and said second land includes a third portion adjacent said second portion free of conductive adhesive, wherein said third portion of said first land is aligned with said third portion of said second land and said base of said lead and said base of said adjacent lead contact said third portions respectively.

* * * * *